United States Patent
Chen et al.

(10) Patent No.: US 9,100,012 B1
(45) Date of Patent: Aug. 4, 2015

(54) ADAPTABLE PROGRAMS USING PARTIAL RECONFIGURATION

(71) Applicant: ALTERA CORPORATION, San Jose, CA (US)

(72) Inventors: Doris Tzu Lang Chen, Toronto (CA); Deshanand Singh, Toronto (CA)

(73) Assignee: Altera Corporation, San Jose, CA (US)

( * ) Notice: Subject to any disclaimer, the term of this patent is extended or adjusted under 35 U.S.C. 154(b) by 185 days.

(21) Appl. No.: 13/715,716

(22) Filed: Dec. 14, 2012

(51) Int. Cl.
*G06F 17/50* (2006.01)
*H03K 19/177* (2006.01)

(52) U.S. Cl.
CPC .......... *H03K 19/17756* (2013.01); *G06F 17/50* (2013.01)

(58) Field of Classification Search
CPC ............ G06F 17/5054; G06F 17/5045; G06F 17/5072; G06F 17/5027; G06F 17/505; G06F 15/7867; H03K 19/177

USPC ............... 716/116, 117; 326/38–41
See application file for complete search history.

(56) References Cited

U.S. PATENT DOCUMENTS

| | | | |
|---|---|---|---|
| 7,541,833 B1* | 6/2009 | Neuendorffer et al. | 326/38 |
| 7,890,916 B1* | 2/2011 | Donlin et al. | 716/116 |
| 2008/0123657 A1* | 5/2008 | Henry et al. | 370/395.3 |
| 2010/0283505 A1* | 11/2010 | Koch et al. | 326/41 |

OTHER PUBLICATIONS

"OpenCL—The open standard for parallel programming of heterogeneous systems", Khronos Group.

* cited by examiner

*Primary Examiner* — Vuthe Siek
(74) *Attorney, Agent, or Firm* — Fletcher Yoder, P.C.

(57) ABSTRACT

Systems and methods for dynamically adjusting programs implemented on an integrated circuit (IC) are provided. During runtime, characteristics of the application may change or become known. Accordingly, the embodiments described herein allow for partial reconfiguration of kernels implemented on an IC during runtime to dynamically alter performance based upon these characteristics.

20 Claims, 6 Drawing Sheets

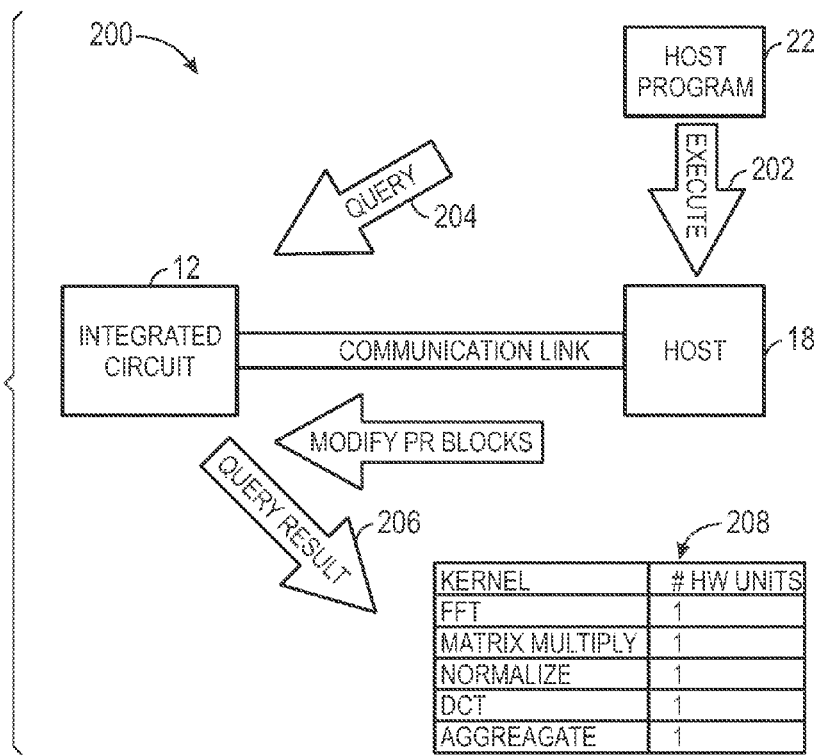
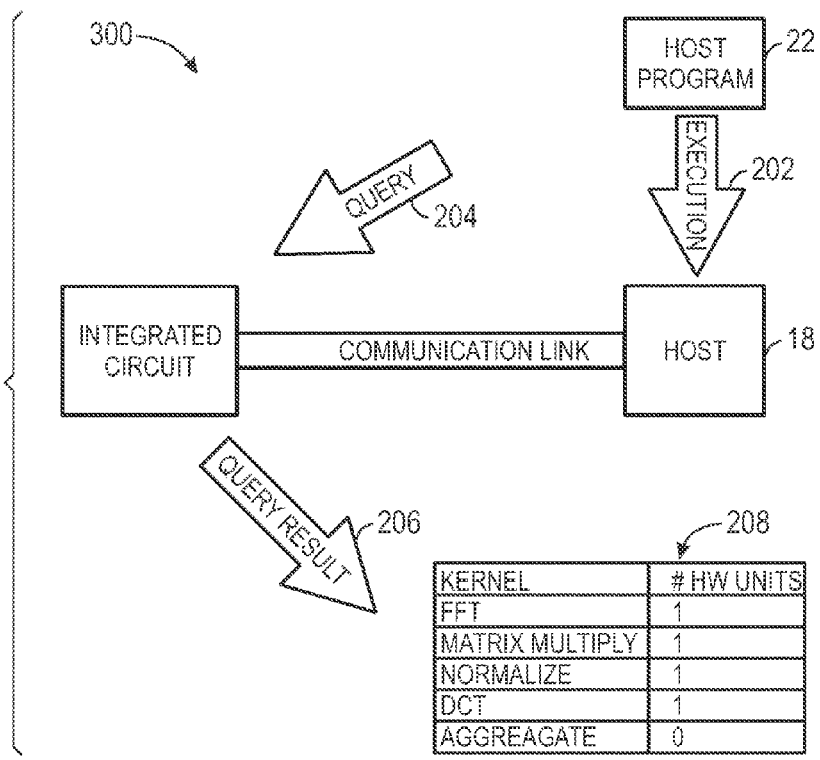

ADAPTABLE PROGRAMS USING PARTIAL RECONFIGURATION

BACKGROUND

The present disclosure relates generally to integrated circuits, such as field programmable gate arrays (FPGAs). More particularly, the present disclosure relates to dynamic adaptation of logic implemented on integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Additionally, FPGAs may include input/output (I/O) logic, as well as high-speed communication circuitry. For instance, the high-speed communication circuitry may support various communication protocols and may include high-speed transceiver channels through which the FPGA may transmit serial data to and/or receive serial data from circuitry that is external to the FPGA.

In ICs such as FPGAs, the programmable logic is typically configured using low level programming languages such as VHDL or Verilog. Unfortunately, these low level programming languages may provide a low level of abstraction and, thus, may provide a development barrier for programmable logic designers. Higher level programming languages, such as OpenCL have become useful for enabling more ease in programmable logic design. The higher level programs are used to generate code corresponding to the low level programming languages. Kernels may be useful to bridge the low level programming languages into executable instructions that may be performed by the integrated circuits. Accordingly, OpenCL programs typically require at least a single hardware implementation for each kernel in the OpenCL program. Unfortunately, as these programs become more complex and/or sophisticated, the performance of the implementation on the integrated circuit may be negatively impacted. Unfortunately, kernels may be of different sizes and shapes, creating difficulty for runtime reconfiguration of the existing hardware. While certain enhancements may be made to the implementation on the integrated circuit, such enhancements have been limited because many characteristics of the programs may not be known until runtime or the characteristics of the programs may change over the operating lifespan of the programs.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for enhancing performance of machine-implemented programs through dynamic adaptation based upon characteristics of the machine-implemented programs. In particular, the present embodiments may provide dynamic adaptation of OpenCL programs executed on integrated circuits (ICs, such as FPGAs) based upon characteristics of the kernels of the OpenCL programs. For example, in one embodiment, a host associated with an OpenCL program may query for characteristics (e.g., performance characteristics) of kernels associated with an OpenCL program. Based upon these characteristics, the host may modify portions of logic stored in the integrated circuit to increase execution performance of the OpenCL program.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 7 is an illustration of the adaptable logic when a number of partial reconfiguration blocks needed to implement the machine-readable program is less than the total number of partial reconfiguration blocks of the integrated circuit, in accordance with an embodiment;

FIG. 8 is an illustration of the adaptable logic when a number of partial reconfiguration blocks needed to implement the machine-readable program is greater than the total number of partial reconfiguration blocks of the integrated circuit, in accordance with an embodiment.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry for enhancing performance of machine-readable programs implemented on an integrated circuit (IC). In particular, kernel modifications, such as adding, removing, or swapping kernels in partial reconfiguration blocks may be used to enhance performance of a machine-implemented program executed on the IC. These modifications may be made based upon performance metrics or other characteristics of the machine-readable program.

Figure 1:
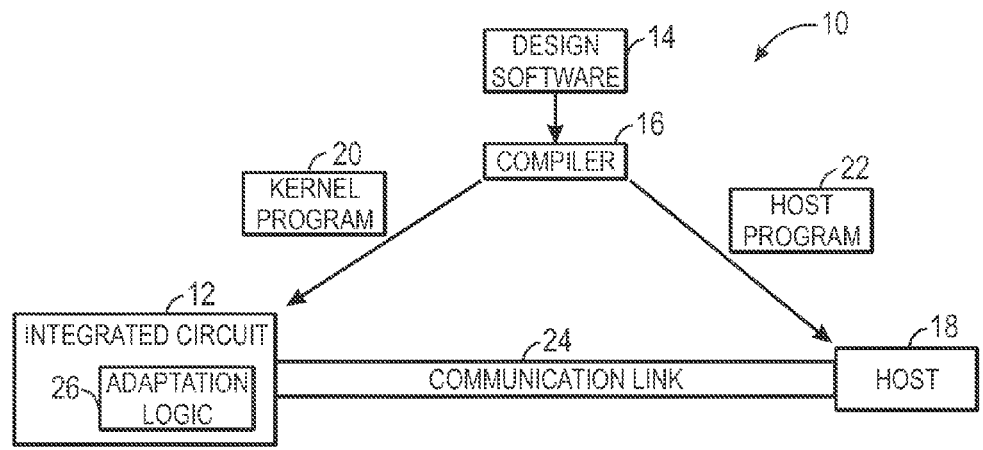
FIG. 1 is a block diagram of a system that utilizes adaptable logic to affect a machine-implemented program, in accordance with an embodiment.

With the foregoing in mind, FIG. 1 illustrates a block diagram of a system 10 that utilizes adaptable logic to affect a machine-implemented program. As discussed above, a designer may desire to implement functionality on an integrated circuit 12 (IC, such as a field programmable gate array (FPGA)). The designer may specify a high level program to be implemented, such as an OpenCL program, which may enable the designer to more efficiently and easily provide programming instructions to implement a set of programmable logic for the IC 12 without requiring specific knowledge of low level computer programming languages (e.g., Verilog or VHDL). For example, because OpenCL is quite similar to other high level programming languages, such as C++, designers of programmable logic familiar with such programming languages may have a reduced learning curve than designers that are required to learn unfamiliar low level programming languages to implement new functionalities in the IC.

The designers may implement their high level designs using design software 14, such as a version of Quartus by Altera™. The design software 14 may use a compiler 16 to convert the high level program into a low level program. The compiler 16 may provide machine-readable instructions representative of the high level program to a host 18 and the IC 12. For example, the IC 12 may receive one or more kernel programs 20 which describe the hardware implementations that should be stored in the IC. The host 18 may receive a host program 22 which may be implemented by the kernel programs 20. To implement the host program 22, the host 18 may communicate instructions from the host program 22 to the IC 12 via a communications link 24, which may be, for example, direct memory access (DMA) communications or peripheral component interconnect express (PCIe) communications. In some embodiments, the kernel programs 20 and the host 18 may enable dynamic adaptability, through adapted logic 26, which may be stored on the IC 16 and controlled by the host 18. As will be described in more detail below, the host 18 may add, remove, or swap kernel programs 20 from the adapted logic 26, such that execution performance may be enhanced.

Figure 2:
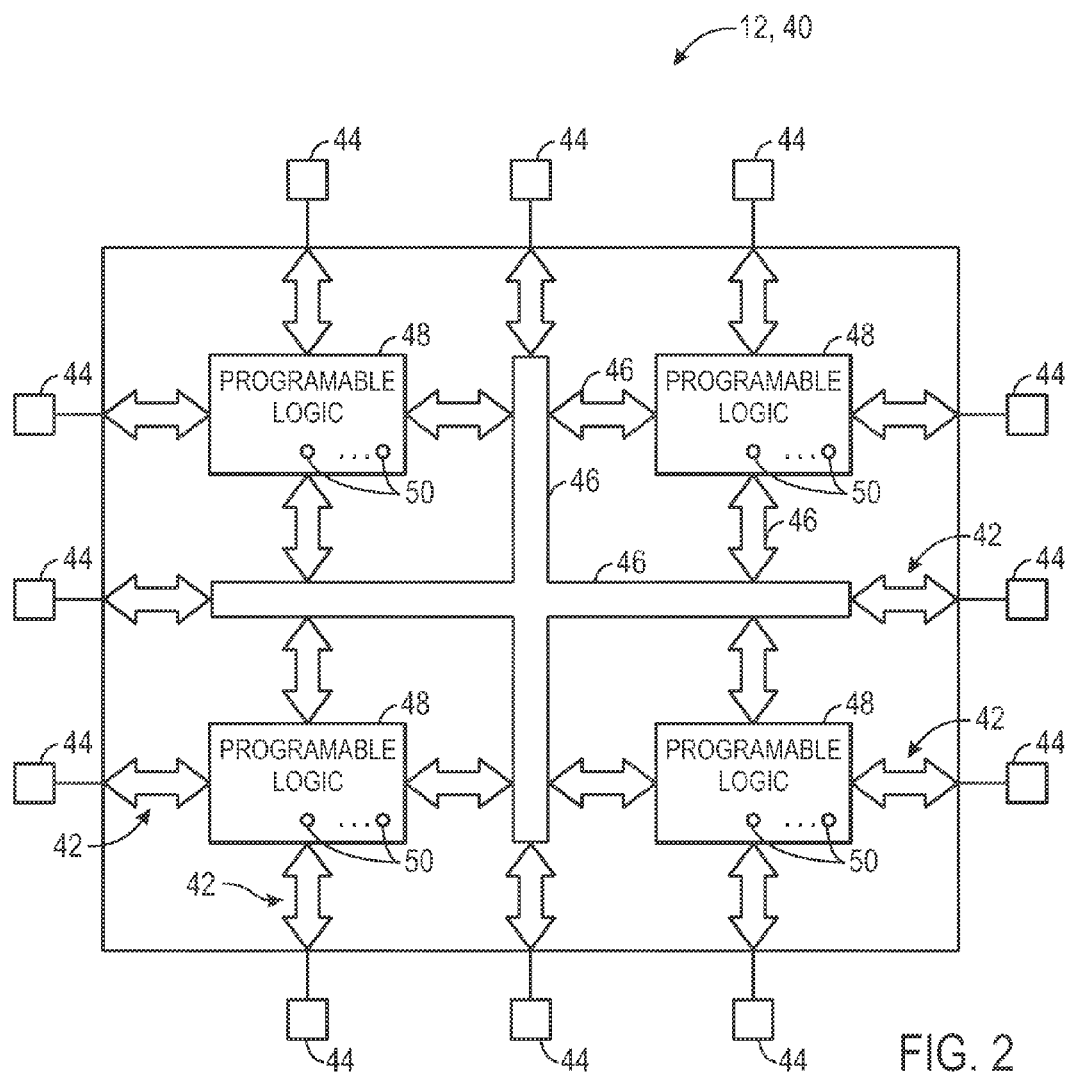
FIG. 2 is a block diagram of a programmable logic device that may include logic useful for implementing the adaptable logic, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the device 40 is referred to as an FPGA, though it should be understood that the device may be any type of programmable logic device (e.g., an application-specific integrated circuit and/or application-specific standard product). As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include adaptable logic that enables partial reconfiguration of the FPGA 40, such that kernels may be added, removed, and/or swapped during the runtime of the FPGA 40.

Programmable logic devices, such as FPGA 40, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Most programmable logic devices are electrically programmed. With electrical programming arrangements, the programmable elements 50 may be formed from one or more memory cells. For example, during programming, configuration data is loaded into the memory cells 50 using pins 44 and input/output circuitry 42. In one embodiment, the memory cells 50 may be implemented as random-access-memory (RAM) cells. The use of memory cells 50 based on RAM technology is described herein is intended to be only one example. Further, because these RAM cells are loaded with configuration data during programming, they are sometimes referred to as configuration RAM cells (CRAM). These memory cells 50 may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of device 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, other device arrangements may use logic that is not arranged in a manner other than rows and columns.

As discussed above, the FPGA 40 may allow a designer to create a customized design capable of executing and performing customized functionalities. Each design may have its own hardware implementation to be implemented on the FPGA 40. For instance, a single hardware implementation is needed for each kernel in a design for the FPGA 40. In some instances, it may be desirable to enhance performance of the program by adding (e.g., replicating), removing, or swapping kernels implemented in the FPGA 40. This is described in more detail below.

Figure 3:
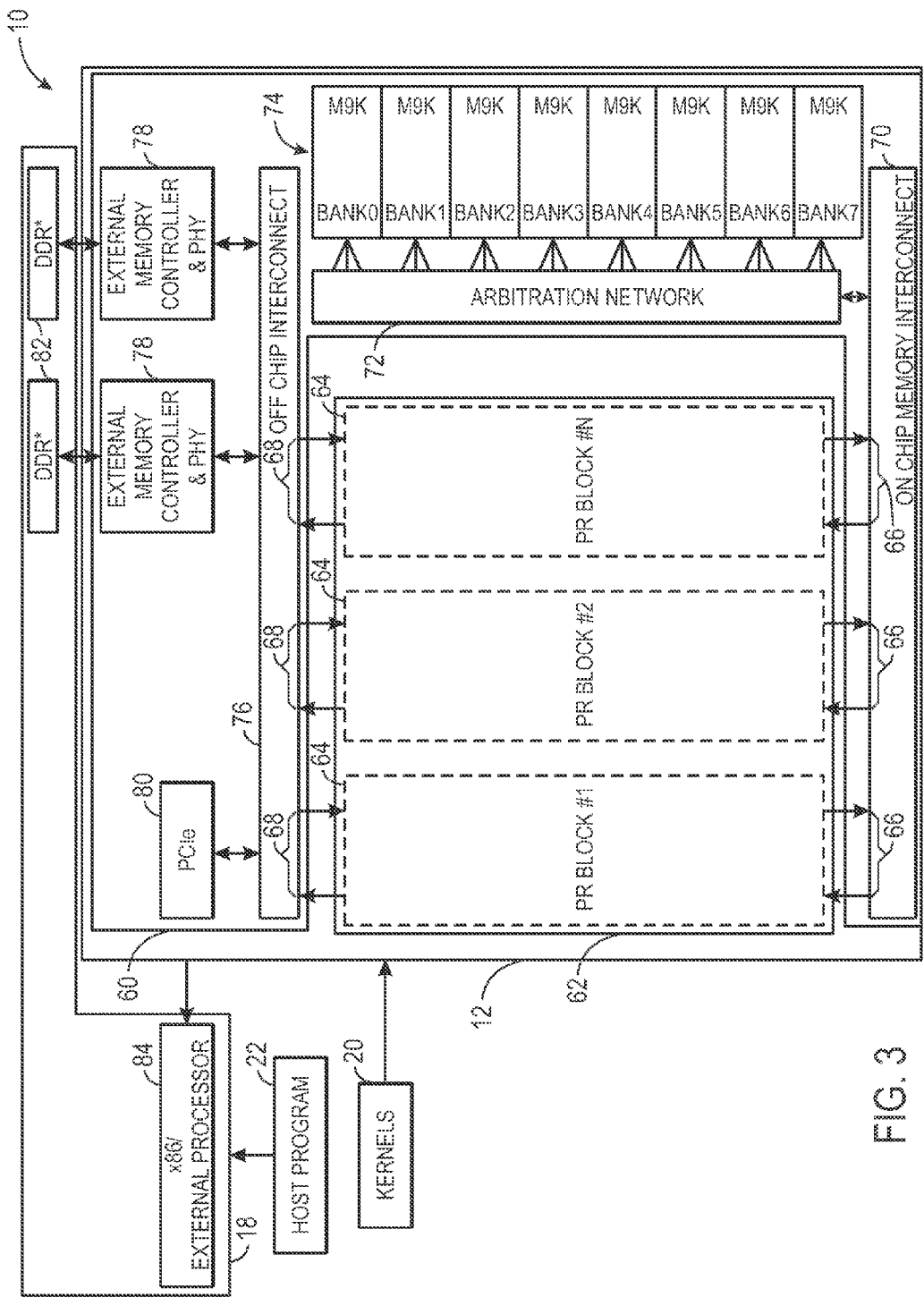
FIG. 3 is a block diagram illustrating elements of the host and integrated circuit of FIG. 1, in accordance with an embodiment.

Referring now to FIG. 3, a block diagram illustrating the system 10, further detailing elements of the host 18 and IC 12 of FIG. 1 is provided. As illustrated, the IC 12 may include fixed components 60 and configurable components 62. Some ICs, such as a Stratix® V FPGA by Altera®, provide partial reconfiguration capabilities. For example, in some embodiments, the configurable components may include a number (N) of partial reconfiguration (PR) blocks 64 stored on an IC 12 (such as FPGA 40 of FIG. 2). The PR blocks 64 may prove an ability to reconfigure part of the IC 12 while the rest of the device continues to work. The PR blocks 64 may include ports to both on-chip memory interconnects and off-chip interconnects (ports 66 and 68, respectively). The PR blocks 64 are not restricted to a particular protocol, however, each of the PR blocks 64 within an IC 12 may agree on a common protocol. For example, each of the PR blocks 64 may use the Avalon® Memory-Mapped (Avalon-MM) interface, which may allow easy interconnect between components in the IC 12.

The size and number of PR blocks 64 may be defined by the hardware implementations and amount of programmable logic available on the IC 12. For example, as will be described in more detail below, the hardware implementations for each kernel program may be placed in a PR block 64. In certain embodiments, the hardware implementations will not span across multiple PR blocks 64. Accordingly, the size of the PR blocks 64 may be determined based upon the largest hardware implementation of the kernel programs. Sizing the PR blocks 64 in this manner may ensure that each and every hardware implementation may fit within a PR block 64. In some embodiments, each of the PR blocks 64 may be sized equally. Accordingly, the number of PR blocks 64 may be determined by dividing the amount of programmable logic devoted to non-fixed space 62 by the size of the PR blocks 64.

Turning now to a discussion of the fixed logic 60, the fixed logic 60 may include an on-chip memory interconnect 70, an arbitration network 72, local memory 74, an off-chip interconnect 76, external memory and physical layer controllers 78, and/or a PCIe bus 80. The on-chip memory interconnect 70 may connect to the PR blocks 64 over the on-chip memory interconnect ports 66 of the PR blocks 64. The on-chip memory interconnect 70 may facilitate access between the PR blocks 64 and the local memory 74 via the arbitration network 72. Further, the off-chip memory interconnect 76 may connect to the PR blocks 64 over the off-chip memory interconnect ports 68 of the PR blocks 64. The off-chip interconnect 76 may facilitate communications between the PR blocks 64 and the host communications components (e.g., the external memory and physical layer controllers 78 and the PCIe bus 80). The external memory and physical layer controllers 78 may facilitate access between the IC 12 and external memory (e.g., host 18 memory 82). Further the PCIe bus 80 may facilitate communication between the IC 12 and an external processor (e.g., host 12 processor 84). As will become more apparent, based on the discussion that follows, communications between the host 18 and the IC 12 may be very useful in enabling adaptable logic on the IC 12.

Figure 4:
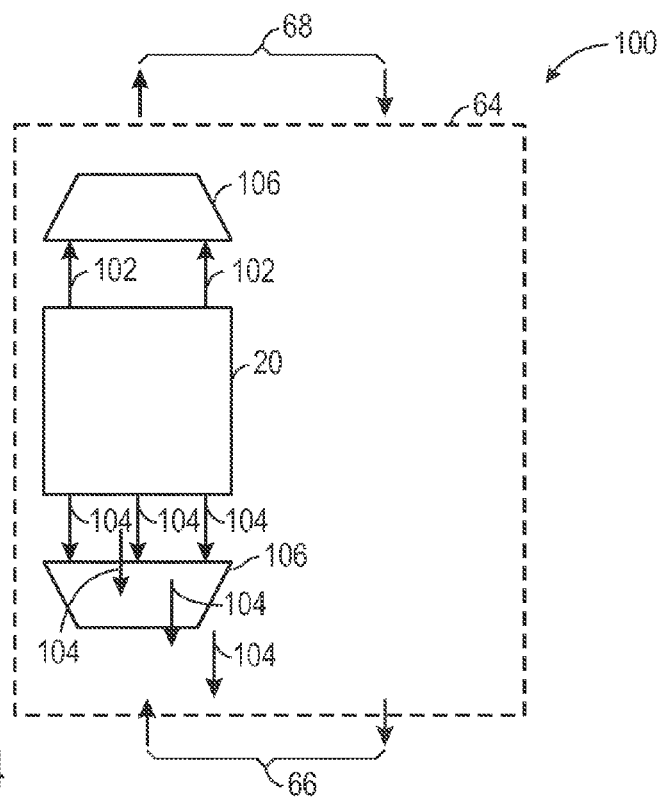
FIG. 4 is a block diagram illustrating an arbitration network for one kernel, in accordance with an embodiment.
Figure 5:
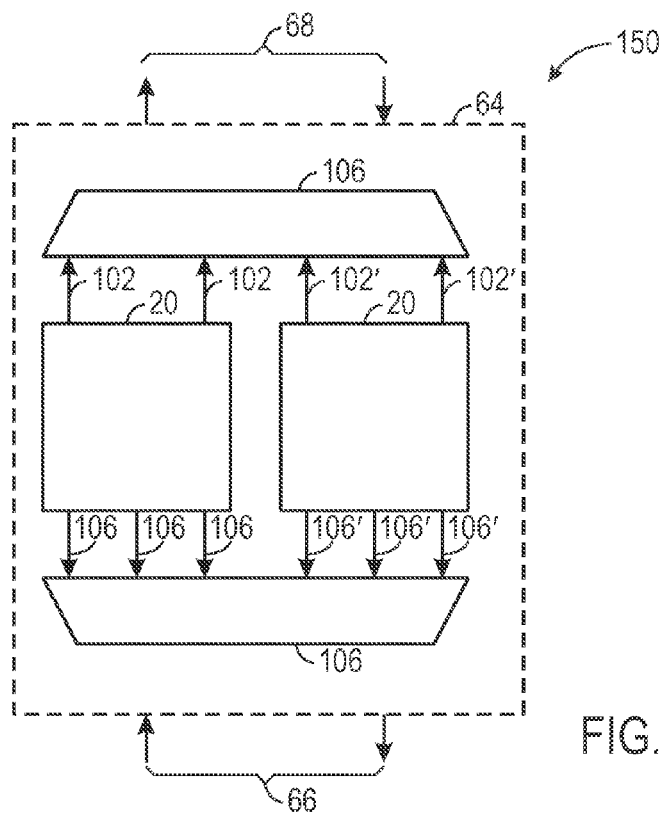
FIG. 5 is a block diagram illustrating an arbitration block for a kernel with multiple copies, in accordance with an embodiment.

FIGS. 4 and 5 illustrate arbitration networks 100 and 150, respectively. The arbitration network 100 of FIG. 4 illustrates the arbitration of multiple masters 102 and 104 of a single kernel 20 via arbitration blocks 106 through the on-chip memory interconnect ports 66 and the off-chip interconnect ports 68. The arbitration network 150 of FIG. 5 illustrates the arbitrations of multiple masters 102, 102', 104, and 104' of multiple copies of kernel 20 via arbitration blocks 106 through the on-chip memory interconnect ports 66 and the off-chip interconnect ports 68. The arbitration networks 100 and 150 ensure that each of the masters 102 and 102' may access off-chip memory 82 (e.g., via the off-chip interconnect 76 and the external memory and physical layer controllers 78). Further these arbitration networks 100 and 150 ensures that each of the masters 104 and 104' may access the on-chip memory 74 (e.g., via the on-chip memory interconnect 70). Containing the arbitration of the kernel 20 masters 102, 102', 104, and 104' within each PR block 64 ensure that each master of each copy of a kernel 20 may efficiently communicate outside of the PR blocks 68.

Figure 6:
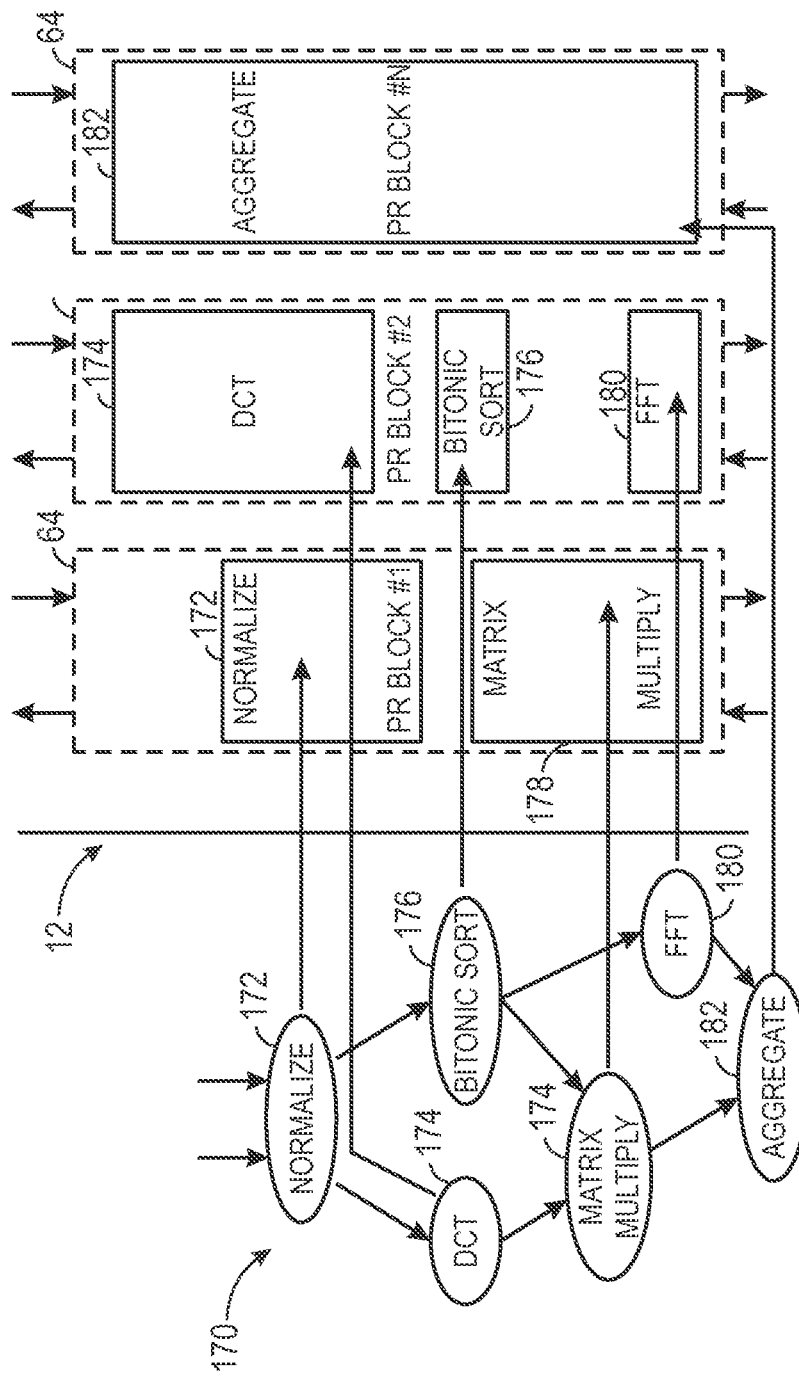
FIG. 6 is a block diagram showing kernel placement in the programmable logic of the integrated circuit, in accordance with an embodiment.

As discussed herein, kernels may be placed in the PR blocks such that the kernels may be removed, added, or swapped via a partial reconfiguration, rather than requiring downtime from other components of the IC. For example, FIG. 6 illustrates a kernel call graph 170 representing a user's host program. In the example provided in FIG. 6, the user's host program (e.g., host program 22 of FIG. 1) includes kernel calls to a normalize kernel 172, a DCT kernel 174, a Bitonic Sort kernel 176, a matrix multiply kernel 178, an FFT kernel 180, and an aggregate kernel 182. In actual practice, a user's host program may contain dozens to hundreds of different kernel calls. In some embodiments, kernel data is not directly propagated between kernels. Instead, computed kernel output data is typically transferred and stored in the main memory of the IC (e.g., memory 74 of FIG. 3). The kernel call graph 170 may be determined by the design software (e.g., design software 14 of FIG. 1) based upon the host program 22. The determined kernel call graph 170 may indicate the operations needed to execute the entire user program. In other words, a complete list of every kernel that will be called may be present in the call graph 170.

To enable kernels to be duplicated, removed, added, and/or swapped during runtime of the host and IC, the design software may attempt to place each kernel in at least one of the PR blocks 64. As discussed above, the PR blocks 64 may be sized to the largest kernel in the kernel call graph 170. Accordingly, if the aggregate kernel 182 is the largest kernel, the PR blocks 64 may be sized to hold the aggregate kernel 182. Thus, as illustrated in the current example, one of the PR blocks 64 (e.g., PR block N) may hold only the aggregate function 64. As may be appreciated, many of the kernels may be much smaller than the largest kernel. Accordingly, under certain circumstances, many kernels may fit within one PR block 64.

For example, in the current example, the normalize kernel 172 and the matrix multiply kernel 178 fit within one PR block (e.g., PR Block 1) and the DCT kernel 174, the bitonic sort kernel 176, and the FFT kernel 180 fit into another PR block 64 (e.g., PR block 2).

Figure 9:
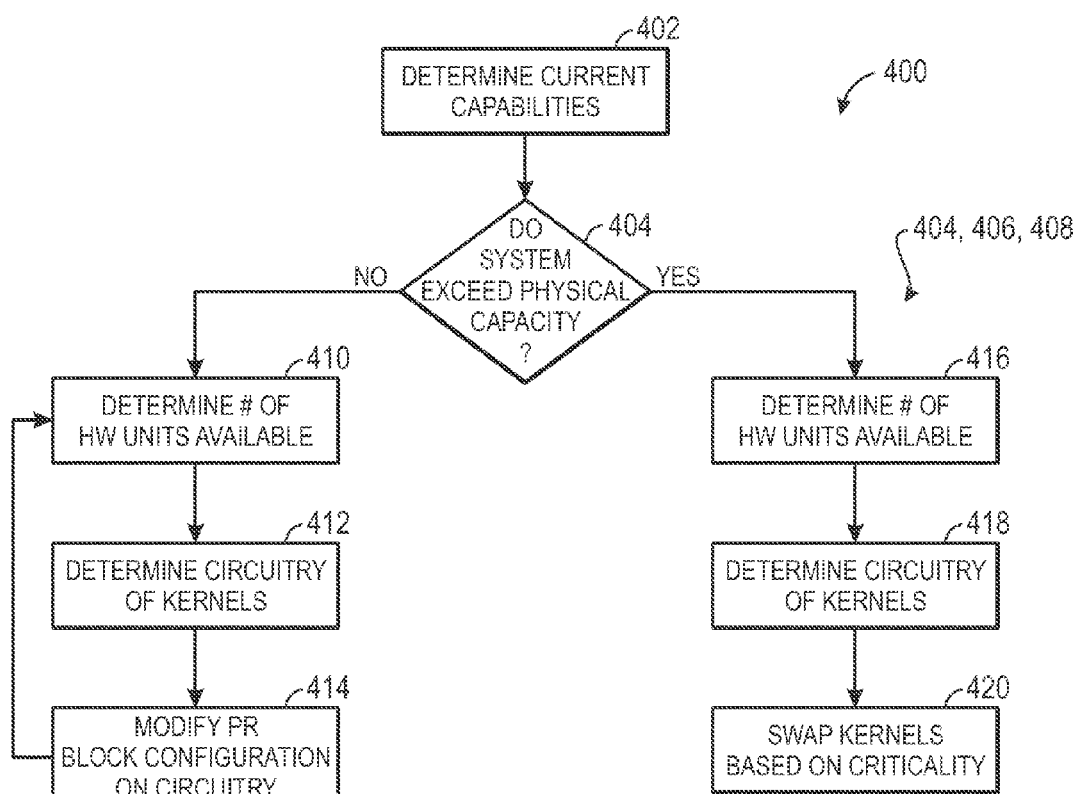
FIG. 9 is a flow chart illustrating the process used in the adaptable logic to enhance performance of the program, in accordance with an embodiment.

As may be appreciated, once each of the kernels is placed in the PR blocks 64, there may still be additional space in the PR block 64. FIG. 7 illustrates such a case 200 where there is an excess of PR blocks 64. In other cases, there may not be enough PR blocks 64 to place each of the kernels of the kernel call graph 170 into a PR block 64. FIG. 8 illustrates such a case 300 where there are not enough PR blocks 64 to hold each of the kernels in the kernel call graph 170. Accordingly, design variants may be introduced by the design software, such that the implementation of the program may be more streamlined. For example, the design software may make use of any unused PR blocks 64 or may create swappable PR blocks 64 that can be used to swap in and out less critical kernels for kernels that were not able to be placed in PR blocks 64. FIG. 9 illustrates a process 400 for adapting to the cases illustrated in FIGS. 7 and 8. Accordingly, for increased clarity, FIGS. 7-9 will be discussed concurrently.

The process 400 may begin by determining the current capabilities of the IC 12 (block 402). For example, as shown in FIGS. 7 and 8, the host program 22 may be executed 202 on the host 18. The host program 22 may cause the host 18 to query 204 the IC to determine a number of PR blocks (e.g. PR blocks 64 of FIG. 6) available to contain kernels associated with the host program 22. The host may then compare the capabilities of the IC 12 with the kernels in the kernel call graph 170, to determine whether the program requirements exceed the capabilities of the IC 12 (determination block 404). For example, the host 18 may determine if there is enough space within the PR blocks 64 to contain the kernels by taking the total number of PR blocks 64 and subtracting the number of PR blocks 64 used to implement one copy of each of the kernels in the kernel call graph 170 of FIG. 6. For example, a query result may be provided (as indicated by arrow 206) may enable the host to determine if each of the kernels may be placed in a PR block 64. In the example provided in FIG. 7, the host 18 determines that each of the kernels 20 invoked by the host program 22 is placed in a PR block (as indicated by the "1" in the # of HW Units column of chart 208). Thus, the host 18 may determine that the program requirements do not exceed the capabilities of the IC 12. However, in the example of FIG. 8, the query results 206 lead to a table 208 that indicates there are not enough PR blocks to store the aggregate kernel 182 in a PR block 46 (as indicated by the "0" in the # of HW Units column of chart 208). When the program requirements do not exceed the current capacity of the IC 12, branch 406 may be taken. When the program requirements exceed the current capabilities of the IC 12, branch 408 may be taken.

To increase throughput of the implementation, in certain embodiments, additional copies of one or more of the kernels may be replicated in the PR blocks 64. This may be especially true when the program requirements do not exceed the current capacity of the IC 12 (branch 406) because there is available space to add additional kernels without requiring swapping kernels. In one embodiment (e.g., branch 406), to add additional kernel copies, the host may determine a number of hardware units (e.g, space inside PR blocks 64) available after a single copy of each kernel has been placed in PR blocks 64 (block 410). The host may also determine the criticality of the kernels in the kernels used in the program (block 412). For example, the host may determine a higher criticality for a kernel based upon a higher usage of the kernel in the host program and/or increased kernel run-times. Based upon the number of hardware units that are available and/or the criticality of the kernels, the PR block configuration may be modified (e.g., add copies of more critical kernels, remove copies of less critical kernels, etc. to the PR blocks) (block 414). Branch 406 may occur every time a kernel call is requested from the host, thus enabling dynamic refreshes to the PR block configuration.

Further, even when there are not enough PR blocks to hold a single copy of each kernel used in the program, the PR blocks may be used to swap in and out kernels, such that each kernel may be executed by the host program when swapped in by the host. As discussed above, when the program requirements exceed the physical capacity of the IC 12, branch 408 may be implemented. First, the host may determine the number of hardware units that are needed (block 416). For example, in the example depicted in FIG. 8, one additional hardware unit is needed to implement the aggregate kernel (as illustrated by the "0"). Next, the criticality of the kernels placed in PR blocks 64 are calculated (block 418). For example, as discussed above, a higher criticality may exist for kernels that are used often or have an increased run-time. The kernels may be swapped based upon criticality, allowing unplaced kernels (e.g., the aggregate kernel of FIG. 8) to be placed at least on a temporary basis (block 420). For example, in some embodiments, the unplaced kernel will be swapped in and a less critical kernel will be swapped out.

Even though swapping kernels (e.g., replacing PR block configurations) may take several times longer than a particular kernel's execution, as long as the kernel swaps are infrequent, the swapping may remain more efficient. For example, a swapped kernel may be executed thousands of times before it is swapped out. Accordingly, in the aggregate, the swapping takes relatively little time. In some embodiments, a user may be able to signify specific kernels for swapping. For example a user may designate at or before compile time that a particular kernel should be swapped (e.g., via the design software).

It is important to note that regardless of whether branch 406 or 408 is taken, the kernel placement within the PR blocks may be driven by area requirements. For example, each kernel may occupy a fixed amount of area within an IC 12. When placing the kernels, the host may place the kernels in a PR block that allows it to occupy the smallest fraction of the IC 12 that will allow a working implementation. Accordingly, the host may then have additional space to replicate kernels to increase system performance.

By implementing kernels within partial reconfiguration blocks, a host may dynamically reconfigure an IC such that the IC may be optimized for performance with particular kernel calls specified in a host program. The host program may remove less critical kernels, add additional copies of critical kernels to increase execution throughput, and may swap kernels to increase the number of kernels that may be implemented on the IC.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method, comprising:
    placing each kernel of a program in partial reconfiguration (PR) blocks of an integrated circuit (IC) to create a kernel configuration of the IC, when there is enough space within the PR blocks; wherein each of the PR blocks comprise a physical location on the IC that can be reconfigured during runtime of the IC;

determining, at runtime or during program execution, one or more modifications to the kernel configuration useful for efficient execution of the program, wherein the one or more modifications comprise addition, removal, exchange, or any combination thereof of one or more kernels to the PR blocks; and changing the kernel configuration based upon the determined modifications.

2. The method of claim 1, comprising determining the modifications based upon a physical capacity of the IC.

3. The method of claim 1, comprising determining the modifications based upon a criticality of the kernels.

4. The method of claim 1, comprising:

determining that there is additional space in the PR blocks after adding each kernel of the program; and adding additional copies of one or more of the kernels to the PR blocks to accelerate performance of the program.

5. The method of claim 4, comprising:

determining the criticality of each of the kernels; wherein adding additional copies of one or more of the kernels comprises adding additional copies of one or more highly critical kernels.

6. The method of claim 5, comprising removing less critical kernels to add additional area for copies of the highly critical kernels.

7. The method of claim 1, determining that there is not enough space in the PR blocks to add each kernel of the program; and adding additional copies of one or more of the kernels to the PR blocks to accelerate performance of the program.

8. An integrated circuit (IC) device comprising:

internal memory;

an off-chip interconnect configured to provide access to a host computer;

an on-chip memory interconnect configured to provide access to the internal memory of the IC; and at least one partial reconfiguration (PR) block comprising a physical location on the IC that can be reconfigured during runtime of the IC; wherein the PR block comprises a standard interface that interfaces with the off-chip interconnect and the on-chip memory interconnect; wherein the standard interface is configured to enable one or more kernels to be added, removed, or exchanged during runtime of the IC.

9. The IC device of claim 8, wherein the PR block is configured to be reconfigured by the host computer.

10. The IC device of claim 9, wherein each PR block in the IC communicates via a common protocol.

11. The IC device of claim 10, wherein the common protocol comprises the Avalon Memory Mapped Interface (Avalon-MM).

12. The IC device of claim 8, wherein the standard interface comprises:

an off-chip memory bus port configured to communicate with the off-chip interconnect;

an on-chip memory bus port configured to communicate with the on-chip memory interconnect;

wherein the off-chip and on-chip memory bus ports are configured with standard input and output pin configurations.

13. The IC device of claim 8, wherein the off-chip interconnect is configured to interface with a peripheral component interconnect express (PCIe) bus that is configured to communicate with a processor of the host computer.

14. The IC device of claim 8, wherein the off-chip interconnect is configured to interface with an external memory or physical layer controller that is configured to communicate with memory of the host computer.

15. The IC device of claim 8, wherein the PR block is configured to store one or more kernels that may be added, removed, or swapped during runtime of the IC device.

16. The IC device of claim 15, comprising an arbitration network configured to enable multiple kernel masters to have arbitrated access off-chip and on-chip memory.

17. The IC device of claim 15, wherein each PR block has a consistent size with one another and the PR block size is equal to the largest hardware implementation of the kernels.

18. A tangible, non-transitory, computer-readable medium, comprising instructions to:

query an integrated circuit (IC) for characteristics of a kernel implementation on the IC; and provide kernel configuration changes for a partial reconfiguration (PR) block of the IC based upon the characteristics during runtime of the IC, wherein the PR block comprises a physical location on the IC that can be reconfigured during runtime of the IC; and the kernel configuration changes comprise addition, removal, exchange, or any combination thereof of one or more kernels to the PR Block.

19. The tangible, non-transitory, computer-readable medium of claim 18, comprising instructions to determine the criticality of kernels used in a host program and provide the configuration changes based upon the criticality.

20. The tangible, non-transitory, computer-readable medium of claim 19, comprising instructions to:

add copies of kernels that are more critical than others;

remove copies of kernels that are less critical than others;

swap kernels to enable new kernel implementations;

or a combination thereof.

* * * * *